(12) United States Patent
Lynch

(10) Patent No.: US 8,628,836 B2
(45) Date of Patent: Jan. 14, 2014

(54) METHOD AND APPARATUS FOR BONDING METALS AND COMPOSITES

(75) Inventor: Stephen Brian Lynch, Portola Valley, CA (US)

(73) Assignee: Apple Inc., Cupertino, CA (US)

(*) Notice: Subject to any disclaimer, the term of this patent is extended or adjusted under 35 U.S.C. 154(b) by 380 days.

(21) Appl. No.: 12/715,702

(22) Filed: Mar. 2, 2010

(65) Prior Publication Data

US 2011/0216481 A1  Sep. 8, 2011

(51) Int. Cl.
| | |
|---|---|
| *H05K 7/00* | (2006.01) |
| *H05K 1/00* | (2006.01) |
| *H05K 1/11* | (2006.01) |
| *B32B 3/30* | (2006.01) |
| *B23K 31/02* | (2006.01) |

(52) U.S. Cl.
USPC ............. 428/99; 428/35.7; 428/100; 428/223

(58) Field of Classification Search
USPC .................................. 428/99, 35.7, 100, 223
See application file for complete search history.

(56) References Cited

U.S. PATENT DOCUMENTS

| | | | |
|---|---|---|---|
| 2,647,079 A | 7/1953 | Burnham | |
| 3,526,694 A | 9/1970 | Lemelson | |
| 4,269,947 A | 5/1981 | Inata et al. | |
| 4,531,705 A | 7/1985 | Nakagawa et al. | |
| 4,547,649 A | 10/1985 | Butt et al. | |
| 4,564,001 A | 1/1986 | Maeda | |
| H788 H | 6/1990 | Schneider, Jr. | |
| 4,961,105 A | 10/1990 | Yamamoto | |
| 4,993,148 A | 2/1991 | Adachi et al. | |
| 5,417,905 A | 5/1995 | Lemaire et al. | |
| 5,837,086 A | 11/1998 | Leeb et al. | |
| 5,872,699 A | 2/1999 | Nishii et al. | |
| 5,925,847 A | 7/1999 | Rademacher et al. | |
| 6,101,372 A | 8/2000 | Kubo | |
| 6,331,239 B1 | 12/2001 | Shirota et al. | |
| 6,410,415 B1 | 6/2002 | Estes et al. | |
| 6,480,397 B1 | 11/2002 | Hsu et al. | |
| 6,574,096 B1 | 6/2003 | Difonzo et al. | |
| 6,821,878 B2 | 11/2004 | Danvir et al. | |
| 6,966,133 B2 | 11/2005 | Krings et al. | |
| 6,996,425 B2 | 2/2006 | Watanabe | |

(Continued)

FOREIGN PATENT DOCUMENTS

| | | |
|---|---|---|
| DE | 195 23 112 | 6/1996 |
| EP | 0 114 565 A1 | 8/1984 |

(Continued)

OTHER PUBLICATIONS

U.S. Appl. No. 12/234,437, entitled "Method and Systems for Forming Housings from Multi-Layer Materials", filed Sep. 19, 2008.

(Continued)

*Primary Examiner* — Brent O'Hern

(57) ABSTRACT

Apparatus, systems and methods for forming a structure that includes a metal and a composite material are disclosed. According to one aspect, a layer stack includes a metal layer with a first surface, the first surface including at least one protruding feature. The layer stack also includes a non-metal layer molded to the first surface of the metal layer, wherein the non-metal layer is molded over and/or around the at least one protruding feature.

19 Claims, 7 Drawing Sheets

(56) References Cited

U.S. PATENT DOCUMENTS

| | | |
|---|---|---|
| 7,134,198 B2 | 11/2006 | Nakatani et al. |
| 7,181,172 B2 | 2/2007 | Sullivan et al. |
| 7,225,529 B2 | 6/2007 | Wang |
| 7,459,373 B2 | 12/2008 | Yoo |
| 7,622,183 B2 | 11/2009 | Shirai et al. |
| 7,691,189 B2 | 4/2010 | En et al. |
| 8,192,815 B2 | 6/2012 | Weber et al. |
| 2002/0097440 A1 | 7/2002 | Paricio et al. |
| 2002/0109134 A1 | 8/2002 | Iwasaki et al. |
| 2002/0130441 A1 | 9/2002 | Robinson et al. |
| 2002/0160145 A1 | 10/2002 | Bauhoff |
| 2003/0006217 A1 | 1/2003 | Dance |
| 2004/0194305 A1* | 10/2004 | deRochemont et al. ........ 29/854 |
| 2005/0023022 A1 | 2/2005 | Kriege et al. |
| 2005/0034301 A1 | 2/2005 | Wang |
| 2005/0115840 A1 | 6/2005 | Dolan |
| 2005/0158576 A1 | 7/2005 | Groll |
| 2006/0055084 A1 | 3/2006 | Yamaguchi et al. |
| 2006/0066771 A1 | 3/2006 | Hayano et al. |
| 2006/0105542 A1 | 5/2006 | Yoo |
| 2007/0018817 A1 | 1/2007 | Marmaropoulos et al. |
| 2007/0045893 A1 | 3/2007 | Asthana et al. |
| 2007/0053504 A1 | 3/2007 | Sato et al. |
| 2007/0275263 A1 | 11/2007 | Groll |
| 2009/0017242 A1* | 1/2009 | Weber et al. ................. 428/35.7 |
| 2009/0104949 A1 | 4/2009 | Sato et al. |
| 2009/0190290 A1 | 7/2009 | Lynch et al. |
| 2009/0236143 A1 | 9/2009 | Nakamura |
| 2009/0260871 A1 | 10/2009 | Weber et al. |
| 2009/0305168 A1 | 12/2009 | Heley et al. |
| 2010/0065313 A1 | 3/2010 | Takeuchi et al. |
| 2010/0294426 A1 | 11/2010 | Nashner |
| 2011/0253411 A1 | 10/2011 | Hum et al. |

FOREIGN PATENT DOCUMENTS

| | | |
|---|---|---|
| EP | 0 633 585 A | 11/1995 |
| EP | 0 997 958 A1 | 5/2000 |
| GB | 788 329 A | 12/1957 |
| JP | 03 013331 A | 1/1991 |
| JP | 03 138131 A | 6/1991 |
| JP | 06/126192 | 5/1994 |
| JP | 2000-000167 | 1/2000 |
| JP | 2008 087409 A | 4/2008 |
| WO | WO 01/34408 | 5/2001 |
| WO | WO 2006/124279 A2 | 11/2006 |

OTHER PUBLICATIONS

Annerfors et al., "Nano Molding Technology on Cosmetic Aluminum Parts in Mobile Phones", Division of Production and Materials Engineering, LTH, 2007.

U.S. Appl. No. 12/358,647, entitled "Method and Apparatus for Forming a Layer Metal Structure with an Anodized Surface", filed Jan. 23, 2009.

"Thermal Shock Resistant Conformal Coating", Product Data Sheet, Dymax Corporation, Jul. 9, 2007, pp. 1-2.

"Marking Lasers: Marking without Limitations", Trumpf Inc., Sep. 10, 2007, pp. 1-36.

* cited by examiner

METHOD AND APPARATUS FOR BONDING METALS AND COMPOSITES

FIELD OF THE INVENTION

The present disclosure relates generally to assembly processes for components that include different materials and, more particularly, to creating components that include a metal and a composite material.

BACKGROUND OF THE INVENTION

Devices, e.g., small electronic devices, often include components that are formed by assembling sections made from different materials. Metal is used in many devices, as for example portable media players and cell phones, because of the structural strength of metal and/or the aesthetic qualities of metal. Thus, in many devices, it becomes necessary to create bonds between metal on materials such as composites.

When sections of components are formed from the same material, bonding the sections is generally not difficult. However, when sections of components are formed from different materials, bonding sections becomes more challenging. For example, bonding a metal section to a section formed from a composite material such as a hard plastic is difficult to accomplish especially when there are space constraints. In other words, creating a joint between a metal piece and a plastic piece that provides a desired bond strength and substantially minimizes the size of the joint is difficult. Often, joints are larger than desired and effectively become macro features of a component, as achieving a desired bond strength may require relatively large joints.

Therefore, what is desired is a method and an apparatus for achieving a relatively strong bond between components of different materials. More specifically, what is needed is a method and an apparatus for creating a relatively strong joint between a metal part and a part formed from a composite material.

SUMMARY

The invention pertains to apparatus, systems and methods for providing facilitating bonding between a metal part and a composite part.

The invention may be implemented in numerous ways, including, but not limited to including, as a method, system, device, or apparatus (including computer readable medium). Several embodiments of the invention are discussed below.

According to one aspect, a layer stack includes a metal layer with a first surface, the first surface including at least one protruding feature. The layer stack also includes a non-metal layer molded to the first surface of the metal layer, wherein the non-metal layer is molded over and/or around the at least one protruding feature. In one embodiment, the at least one protruding feature is a flange machined onto the metal layer. In another embodiment, the at least one protruding feature is formed by adding a wire bond or a solder ball to the metal layer. In still another embodiment, the non-metal layer is a thermoplastic layer.

According to another aspect, an assembly includes a substrate arrangement and a non-metal layer. The substrate arrangement includes a metal substrate and a prongle component. The prongle component includes at least one protruding feature. The non-metal layer is formed over the protruding feature, and the non-metal layer engages the protruding feature.

In accordance with yet another aspect, an electronic device includes a bezel and a composite component. The bezel is formed from a metal material, and includes at least one flange with a first surface. The first surface has at least one protruding feature formed thereon and extending therefrom. The composite component is formed over the protruding feature and the flange. The composite component engages the at least one protruding feature and the flange to engage the bezel. In one embodiment, the protruding feature is a wire or a solder ball.

According to still another aspect, a method for bonding a composite material to a metal material includes obtaining a metal substrate and obtaining a prongle piece that has at least one protruding feature. The method also includes bonding the prongle piece to the metal substrate and forming a composite piece over the protruding feature to bond the composite piece with the at least one protruding feature. In one embodiment, the metal substrate includes a flange, and bonding the prongle piece to the metal substrate includes bonding the prongle piece to the flange.

In accordance with another aspect, a method for bonding a composite material to a metal material includes obtaining a metal substrate and forming a plated surface on the metal substrate. The plated surface includes at least one plated feature. The method also includes forming a prongle piece over the plated surface. The prongle piece has at least one protruding feature that is formed over the at least one plated feature. A composite piece is formed over the protruding feature to bond the composite piece with the protruding feature.

Other aspects and advantages will become apparent from the following detailed description taken in conjunction with the accompanying drawings which illustrate, by way of example, the principles of the invention.

BRIEF DESCRIPTION OF THE DRAWINGS

The accompanying drawings, which are incorporated into and constitute a part of this specification, illustrate one or more example embodiments and, together with the description of example embodiments, serve to explain the principles and implementations associated with the specification.

DETAILED DESCRIPTION OF EXAMPLE EMBODIMENTS

Figure 1A:
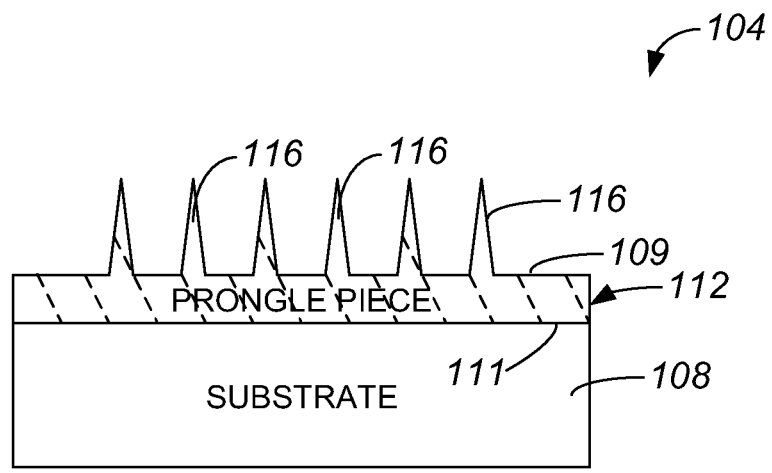
FIG. 1A is a diagrammatic representation of a substrate assembly, e.g., a metal substrate assembly, in accordance with one embodiment.

The invention pertains to apparatus, systems and methods for providing a bond between parts formed from different materials. In one embodiment, a bond may be formed between a metal piece and a piece formed from a composite material, i.e., a composite piece, by providing protrusions on the metal piece to which the composite piece may be bonded. The protrusions, e.g., protruding features or prongles, may be formed from a material that is easier to bond to the metal piece than the composite material, and the composite piece may be bonded to the protrusions. By sizing the prongles to provide a significant amount of surface area, a relatively strong bond between the composite piece and the prongles and, hence, the metal piece, may effectively be promoted. The prongles enable a relatively strong joint between the overall metal piece, i.e., the metal piece and the prongles, and a composite piece to be formed.

An overall assembly, or a layer stack, may generally include a metal layer with a surface with at least one prongle. The layer stack may also include a non-metal layer, e.g., a layer formed from a composite material such as a thermoplastic or a hard plastic, that is substantially molded to the surface of the metal layer with the prongle such that the composite material essentially interlocks with the prongle. In other words, a layer formed from a non-metal such as a composite is molded around or otherwise bonded to the prongle.

The configuration of a prongle may vary depending upon the requirements of a device in which the prongle is included. A prongle may be a flange, protuberance, protruding feature, or projection machined onto a metal part. It should be appreciated, however, that a prongle may instead be a flange or the like formed on the metal part, e.g., through a plating process, or a flange or the like that is bonded to the metal part, e.g., through a wire bond or solder process.

In general, prongles are sized to provide a surface to which a composite material may be bonded. The size, e.g., dimensions, of prongles may be dependent upon a variety of factors including, but not limited to including, the size of the parts on which the prongles are essentially bonded and the materials from which the parts are made. Prongles may, in one embodiment, effectively be wire pieces that are bonded, e.g., soldered, to a surface of a substrate. In another embodiment, prongles may be solder balls which are soldered onto a surface of a substrate.

The apparatus, systems, and methods of the invention allow for the formation of prongles, as well as to the assembly of a component that includes the prongles and a composite part bonded to the prongles. In one embodiment, prongles may be included on a metal bezel, and a composite part may be bonded to the metal bezel. A metal part such as a bezel with prongles and a composite part that is bonded to the metal part through the prongles may be included in small form factor electronic devices such as handheld electronic devices, as for example mobile phones, media players, user input devices (e.g., mouse, touch sensitive devices), personal digital assistants, remote controls, etc. The apparatus, systems, and methods may also be used with relatively larger form factor electronic devices such as portable computers, tablet computers, displays, monitors, televisions, etc.

Embodiments are described herein in the context of forming prongles on a metal part and bonding a composite part to the prongles and, thus, effectively bonding the composite part to the metal part. The following detailed description is illustrative only, and is not intended to be in any way limiting. Other embodiments will readily suggest themselves to skilled persons having the benefit of this disclosure. Reference will now be made in detail to implementations as illustrated in the accompanying drawings. The same reference indicators will generally be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Referring initially to FIG. 1A, a substrate assembly, e.g., a metal substrate assembly or arrangement, which includes prongles will be described in accordance with an embodiment of the invention. In one embodiment, a substrate assembly 104 may include a substrate 108 and a prongle piece 112 that is bonded to, or otherwise coupled to, substrate 108. As illustrated in FIG. 1A, prongle piece 112 may be a layer bonded to substrate 108. Substrate 108 is typically formed from metal. Prongle piece 112 may be formed from substantially any material that may maintain a relatively strong bond with substrate 108 on a first surface 109. By way of example, prongle piece 112 may be formed from any suitable material which forms a stronger bond with substrate 108 than substrate 108 would likely form with a composite material (not shown). Although prongle piece 112 may be formed from metal, prongle piece 112 is not limited to being formed from metal.

Prongle piece 112 generally includes at least one prongle 116 on a second surface 111. Although prongles 116 are illustrated as being integrally formed as a part of prongle piece 112, it should be appreciated that prongles 116 are not limited to being integrally formed as part of prongle piece 112. In one embodiment, prongle piece 112 may effectively be a single prongle 116. That is, prongle piece 112 may essentially comprise a single prongle.

Figure 1B:
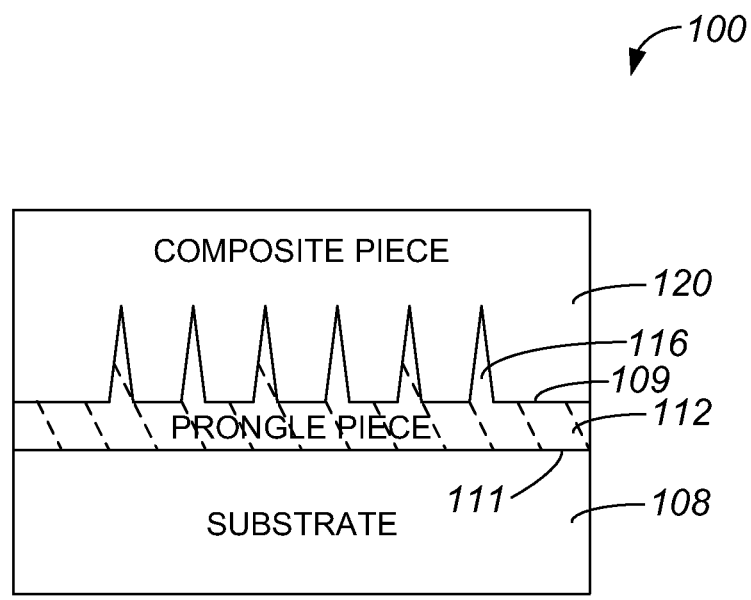
FIG. 1B is a diagrammatic representation of an overall assembly that includes a substrate assembly, e.g., substrate assembly 104 of FIG. 1A, and a composite piece bonded to a prongle piece of the substrate assembly in accordance with one embodiment.

Prongle piece 112 is arranged to effectively bond to or otherwise engaged with a composite material (not shown). Prongle piece 112 or, more specifically, prongles 116 on prongle piece 112 provide surfaces to which a composite material (not shown) may bond. Through prongle piece 112, such a composite material (not shown) may bond to substrate assembly 104. FIG. 1B is a diagrammatic representation of an overall assembly that includes substrate assembly 104 and a composite piece bonded to prongle piece 120 of the substrate assembly in accordance with an embodiment of the invention. An overall assembly 100 includes a composite piece 120 that is essentially formed over, or molded over and/or around, prongle piece 112. Composite piece 120 bonds with prongle piece 112 such that composite piece 120 interlocks with prongle piece 112.

Because prongle piece 112 includes prongles 116 which provide a larger surface area or mechanical interlock for bonding than substrate 108, the bond between composite piece 120 and prongle piece 112 is generally relatively strong. Further, prongle piece 112 may be formed from a material that is more conducive to the formation of a strong bond between composite piece 120 and prongle piece 112 than the material from which substrate 108 is formed.

A substrate piece may include a prongle piece that is integral with a substrate. Alternatively, however, a prongle piece such as prongle piece 112 of FIGS. 1A and 1B may be substantially bonded on a substrate, e.g., substrate 108, to create a substrate assembly, e.g., substrate assembly 104. For instance, a separate, substantially pre-formed prongle piece may be bonded to a substrate in order to form a substrate assembly, or a prongle piece may effectively be molded onto a substrate.

Figure 2:
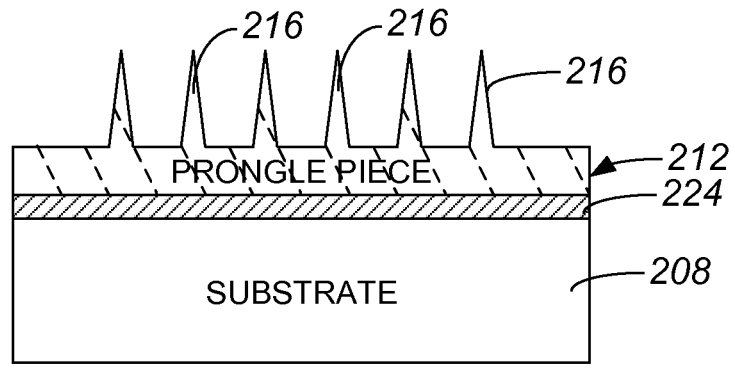
FIG. 2 is a diagrammatic representation of a substrate assembly, e.g., a metal substrate assembly, that includes a prongle piece bonded to a substrate in accordance with one embodiment.

FIG. 2 is a diagrammatic representation of a substrate assembly, e.g., a metal substrate assembly, that includes a separate, substantially pre-formed prongle piece bonded to a substrate in accordance with an embodiment of the invention. A substrate assembly 204 includes a substrate 208 which, in the described embodiment, may be a metal substrate or layer. A prongle piece 212, which includes at least one prongle 216 or protruding feature, may be bonded to substrate 208 by a bonding layer 224.

Bonding layer 224 may be an adhesive layer which effectively affixes prongle piece 212 to substrate 208. In lieu of being an adhesive layer, bonding layer 224 may instead be formed by substantially fusing prongle piece 212 to substrate 208. By way of example, a bottom surface of prongle piece 212 and a top surface of substrate 208 may be heated and then pressed together such that bonding layer 224 is formed.

Figure 3:
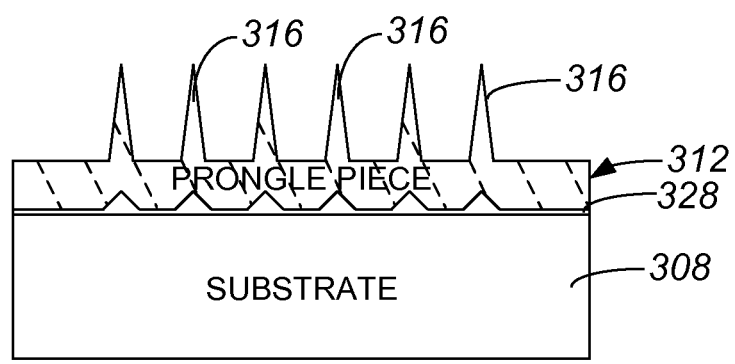
FIG. 3 is a diagrammatic representation of a substrate assembly, e.g., a metal substrate assembly, that includes a prongle piece formed onto a substrate in accordance with one embodiment.

FIG. 3 is a diagrammatic representation of a substrate assembly, e.g., a metal substrate assembly, that includes a prongle piece that is effectively molded onto a substrate in accordance with an embodiment of the invention. A substrate assembly 304 includes a substrate 308, e.g., a metal substrate, onto which a layer of features 328 are formed. Feature layer 328 may be molded onto substrate 308, and may effectively provide a template for the formation of a prongle piece 312. Prongle piece 312, which includes at least one prongle 316 may be overmolded onto feature layer 328. A mold (not shown) may be placed over feature layer 328, and a material such as metal may be introduced into the mold such that prongle piece 312 may be created.

Figure 4:
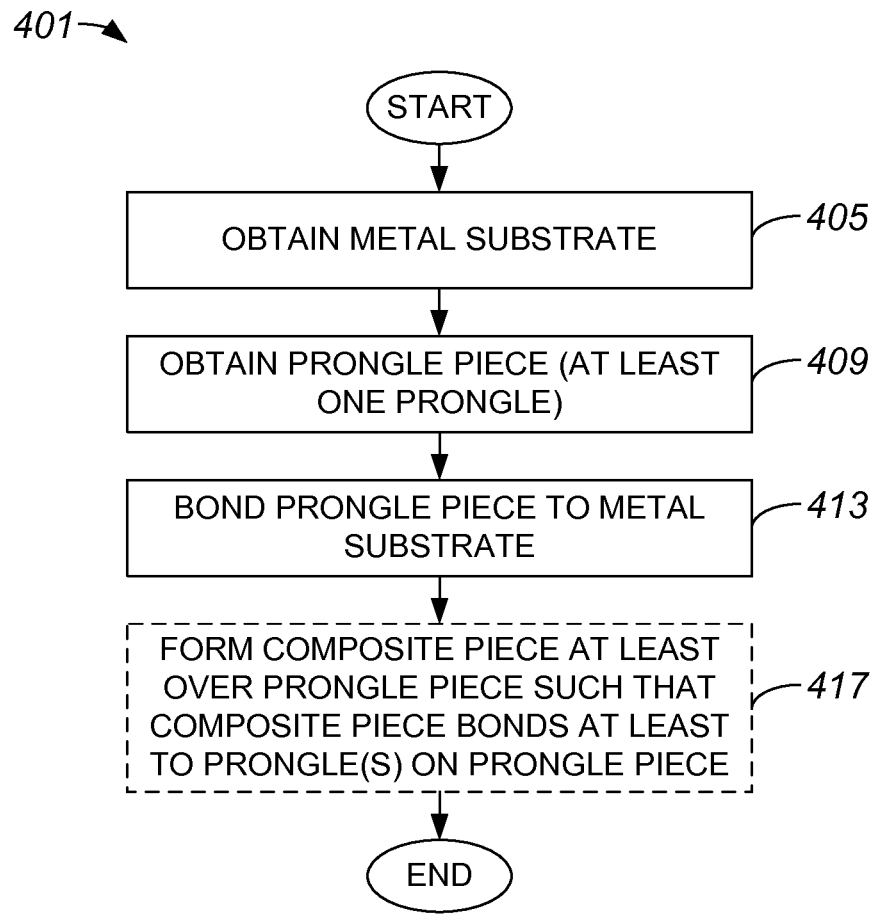
FIG. 4 is a process flow diagram which illustrates a first method of forming a substrate assembly that include prongles in accordance with one embodiment.
Figure 5:
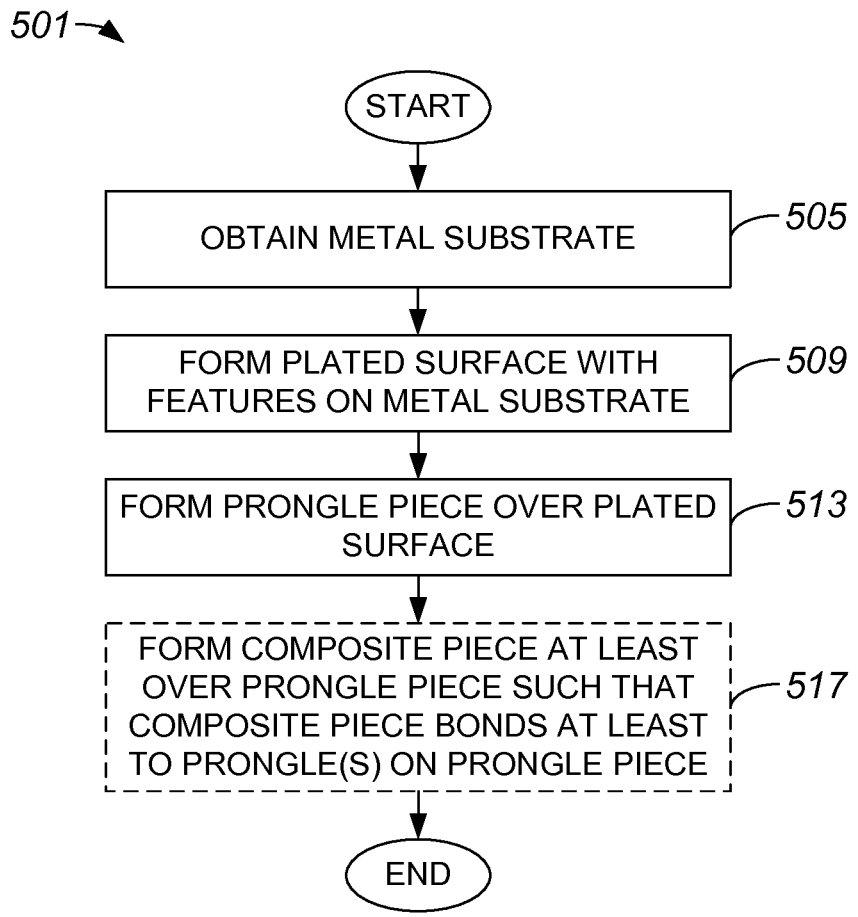
FIG. 5 is a process flow diagram which illustrates a second method of forming a substrate assembly that include prongles in accordance with one embodiment.

In general, as previously mentioned, prongles may be substantially integral to substrate. That is, prongles may effectively be machined onto a metal substrate. For example, etching processes may be used to create prongles on of a metal substrate. However, as discussed above, prongles may instead be associated with an external structure that is bonded to a surface of a metal substrate, or may be otherwise created on a surface of a metal substrate. With reference to FIGS. 4 and 5, methods of bonding prongles to the surface of a metal substrate and otherwise creating prongles on a surface of a metal substrate will be described, respectively.

FIG. 4 is a process flow diagram which illustrates a method of forming a substrate assembly, e.g., substrate assembly 204 of FIG. 2, that include prongles in accordance with an embodiment of the invention. A method 401 of forming a substrate assembly that includes prongles begins at step 405 in which a metal substrate is obtained. The metal substrate may be a metal bezel suitable for use as part of a portable electronic device or a cellular phone device. In one embodiment, the metal substrate may be configured such that the metal substrate includes a flange.

After the metal substrate is obtained, a prongle piece is then obtained in step 409. The prongle piece may be a structure that includes a plurality of prongles or the prongle piece may be a structure that is effectively a single prongle. When the prongle piece is a structure that includes a plurality of prongles, the prongle piece may include a substrate that supports the plurality of prongles. The prongle piece may be formed from metal, e.g., the same metal that forms the metal substrate. It should be appreciated, however, that the prongle piece is not limited to being formed from metal, and may generally be formed from substantially any material which is relatively easily bonded to, and may form a relatively strong bond with, the metal substrate. A prongle piece may be formed, for example, from adhesive materials such as epoxy. In general, prongle piece may be formed from any material which bonds more easily to the metal substrate than a composite material, i.e., the composite material from which a composite piece that is to be molded over the prongle piece is formed.

Once the prongle piece is obtained, the prongle piece is bonded to the metal substrate in step 413. Bonding the prongle piece to the metal substrate may include, but is not limited to including, essentially gluing the prongle piece to the metal substrate using an adhesive material, soldering the prongle piece to the metal substrate, and heating the prongle piece and/or the metal substrate to effectively fuse the prongle piece to the metal substrate.

In step 417, a composite piece may be formed over the prongle piece, e.g., to create an overall structure. The composite piece may be formed over the prongle piece such that the composite piece bonds with the prongles on the prongle piece. When the metal substrate is a bezel of a device, the composite piece may be a thermoplastic piece that is arranged to effectively be bonded to the bezel. The method of forming a substrate assembly is completed after the prongle piece is bonded to the metal substrate or, if an overall structure that includes the substrate assembly is formed, the method is completed after the composite material is formed over the prongle piece.

FIG. 5 is a process flow diagram which illustrates a second method of forming a substrate assembly, e.g., substrate assembly 304 of FIG. 3, that include prongles in accordance with an embodiment of the invention. A method 501 of forming a substrate assembly begins at step 505 in which a metal substrate is obtained. Once the metal substrate is obtained, a plated surface with features is formed on the metal substrate in step 509. The plated surface, e.g., an electroformed surface, may be formed using a mold. As will be appreciated by those skilled in the art, electroforming allows parts to be made by plating electroformed material, e.g., nickel or copper, onto surfaces. The features in the plated surface are typically configured to enable prongles to be formed thereon.

After the plated surface is formed on the metal substrate, a prongle piece which includes at least one prongle extending therefrom is formed over the plated surface in step 513. In one embodiment, a composite piece may be formed over the prongle piece, e.g., to create an overall structure, in step 517. The composite piece may be formed over the prongle piece such that the composite piece bonds with the prongles on the prongle piece. When the metal substrate is a bezel of a device, the composite piece may be a thermoplastic piece that is arranged to effectively be bonded to the bezel. The method of forming a substrate assembly is completed after the prongle piece is bonded to the metal substrate or, if an overall structure that includes the substrate assembly is formed as discussed with respect to step 517, the method is completed after the composite material is formed over the prongle piece.

Figure 6:
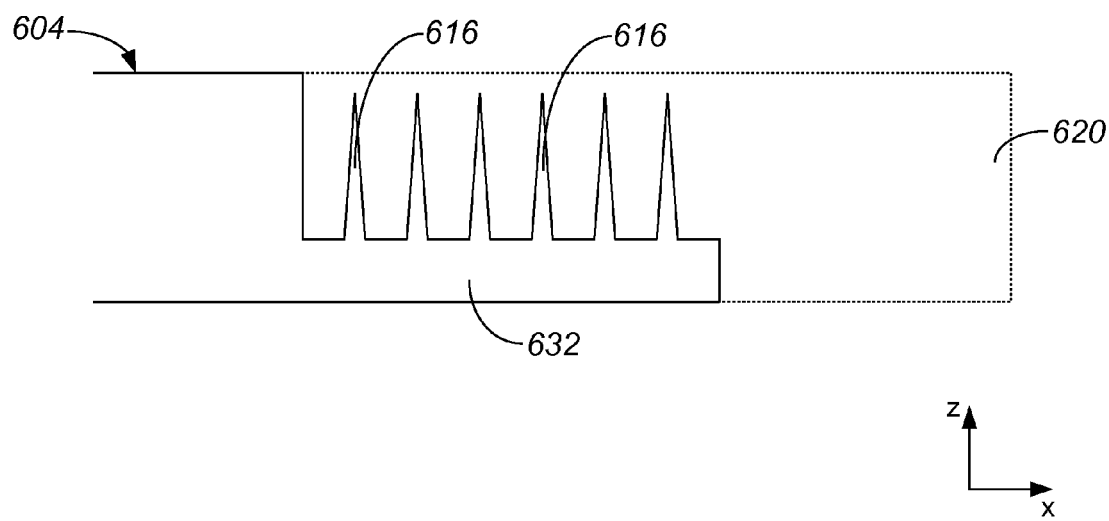
FIG. 6 is a diagrammatic representation of a joint formed between a metal piece, which includes prongles on one surface, and a composite piece in accordance with one embodiment.

As previously mentioned, a metal substrate may include a flange. A flange may be arranged to be a part of a lap joint, or an overlapping joint, such that the flange effectively interlocks with a composite piece to form a lap joint. Prongles may be formed on a surface of the flange to facilitate the interlocking of metal substrate to the composite piece. FIG. 6 is a diagrammatic representation of a joint, e.g., a lap joint, formed between a metal substrate assembly, which includes a flange with prongles on one surface, and a composite piece in accordance with an embodiment of the invention. A joint is formed to effectively bond a metal substrate assembly 604 and a composite piece 620. The joint, as shown, may be a lap joint in that a portion of composite piece 620 effectively overlaps a flange portion 632 of metal substrate assembly 604.

Prongles 616 are present on a surface of flange portion 632. Prongles 616 may be bonded to flange portion 632, or otherwise formed on a surface of flange portion 632, as for example using the method described above with respect to FIG. 5. Alternatively, prongles 616 may be substantially machined onto flange portion 632.

The number of prongles 616, as well as the size and shape of prongles 616, may vary widely. In general, prongles 616 have a height that extends from a top surface of flange portion 632 to approximately a top of metal substrate assembly 604. For example, the height of prongles 616 may be approximately 0.2 millimeters (mm), and the height of flange portion 632 as measured from a bottom surface to a surface at which prongles 616 substantially begin may be approximately 0.2 mm. The overall height of metal substrate assembly 604 may be approximately 0.5 mm. In one embodiment, the length of flange portion 632 may be approximately 3.0 mm.

It should be appreciated, however, that the relative heights of prongles 616, flange portion 632, and metal substrate assembly 604 may vary widely. By way of example, prongles may have a height of approximately 0.125 mm while flange portion 632 has a height of approximately 0.25 mm and metal substrate assembly 604 has an overall height of approximately 0.5 mm.

Figure 7:
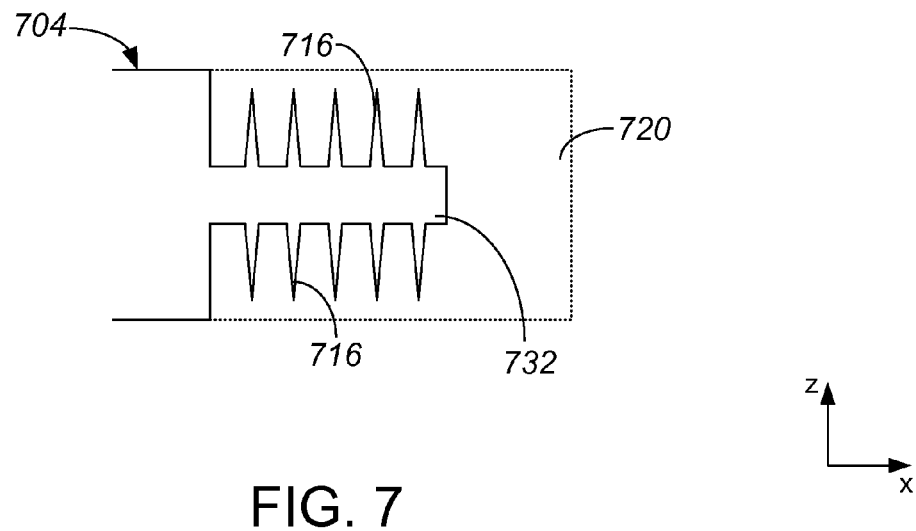
FIG. 7 is a diagrammatic representation of a joint formed between a metal piece, which includes prongles on a plurality of surfaces, and a composite piece in accordance with one embodiment.

When a metal substrate assembly includes a flange, prongles are not limited to being formed on a single surface of the flange. By way of example, prongles may be formed on a top surface of a flange as well as on a bottom surface of the flange. FIG. 7 is a diagrammatic representation of a joint formed between a metal substrate assembly, which includes a flange portion with prongles on a plurality of surfaces, and a composite piece in accordance with an embodiment of the invention. A joint, e.g., a lap joint, is formed to effectively bond a metal substrate assembly 704 and a composite piece 720. In the embodiment as shown, the joint includes a flange portion 732 of metal substrate assembly 704 and a portion of composite piece 720.

Prongles 716 are present on a top surface and a bottom surface of flange portion 732. Prongles 716 may be substantially integral with flange portion 732, e.g., machined onto flange portion 732, bonded to flange portion 732, or otherwise formed on flange portion 732.

Figure 8:
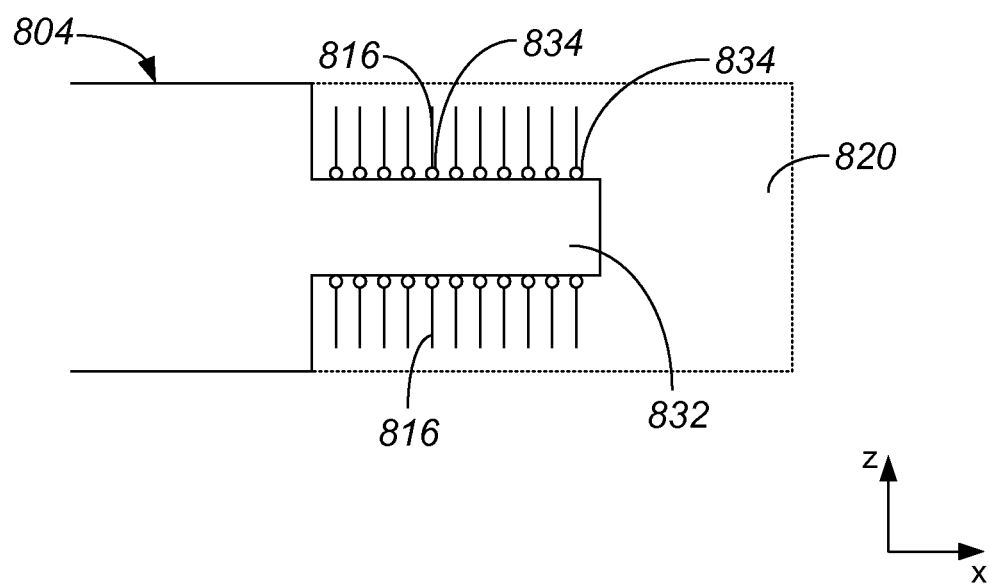
FIG. 8 is a diagrammatic representation of a joint formed between a metal piece, which includes prongles that are individually bonded to the metal piece, and a composite piece in accordance with one embodiment.

In one embodiment, prongles may be formed from individual pieces of wire that are bonded, as for example through wire bonding or soldering, to a surface of a metal substrate. Referring next to FIG. 8, a joint formed between a metal substrate assembly, which includes prongles that are individual wires bonded to the metal substrate assembly, and a composite piece will be described in accordance with an embodiment of the invention. A joint, which may be a lap joint, is effectively formed as a junction between a metal substrate assembly 804 and a composite piece 820. The joint may include, as shown, a flange portion 832 of metal substrate assembly 804 and a portion of composite piece 820.

Prongles 816, in one embodiment, may be formed from lengths of wire that are joined to at least one surface of flange portion 832. As shown, solder joints 834 effectively couple prongles 816 to two surfaces of flange portion 832. It should be appreciated that a solder joint 834 and a length of wire may, together, be considered as an overall prongle 816.

Figure 9:
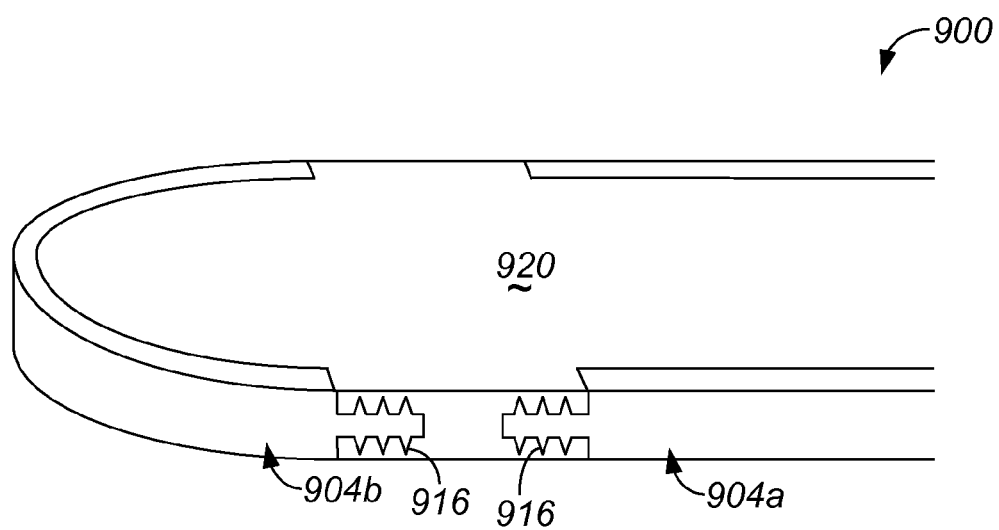
FIG. 9 is a diagrammatic perspective representation of a device which includes a metal piece with prongles and a composite piece that is bonded to the metal piece through the prongles in accordance with one embodiment.

As previously mentioned, prongles may be used to efficiently join a metal frame to a composite piece, e.g., a plastic piece, in a portable electronic device. For example, an electronic device may include a metal frame that is to be interfaced with a composite piece. FIG. 9 is a diagrammatic perspective representation of a device which includes a metal piece with prongles and a composite piece that is bonded to the metal piece through the prongles in accordance with an embodiment of the invention. A device 900 includes metal bezel pieces 904a, 904b, as well as a composite piece 920. Composite piece 920 is configured to substantially interlock with prongles 916 formed on surfaces of metal bezel pieces 904a, 904b. In one embodiment, composite piece 920 is arranged to be molded or otherwise formed over prongles 916 such that composite piece 920 is essentially joined with both metal bezel piece 904a and metal bezel piece 904b.

When prongles 916 are included in metal bezel pieces 904a, 904b, the joint formed by joining composite piece 920 to bezel piece 904a and the joint formed by joining composite piece 920 to bezel piece 904b are relatively strong due, at least in part, to the amount of surface area associated with the bonds associated with the joints. Further, as shown, composite piece 920 is bonded to metal bezel pieces 904a, 904b within the thickness of metal bezel pieces 904a, 904b. Bonding composite piece 920 to metal bezel pieces 904a, 904b within the thickness of metal bezel pieces 904a, 904b allows joints that are formed to occupy substantially no internal volume of device 900 and substantially no external volume of device 900. Although only a few embodiments of the invention have been described, it should be understood that the invention may be embodied in many other specific forms without departing from the spirit or the scope of the invention. By way of example, the size and shape of prongles, as well as the number of prongles formed on a substrate, may vary widely. A prongle may be, in one embodiment, a ball of solder provided on a substrate. In general, the size, shape, and number of prongles may be dependent on a number of factors including, but not limited to including, the size of an assembly that includes a metal piece bonded to a composite piece.

While a metal substrate with prongles has been described as being a metal bezel of an electronic device such s a portable electronic device, and a composite piece has been described as a thermoplastic piece of the device that is to be bonded to the metal bezel, it should be appreciated that a metal substrate with prongles is not limited to being a part of an electronic device. Prongles may generally be used to efficiently join two different pieces in any device or structure.

A composite piece or layer has been described as molded over or interlocked with prongles of a substrate assembly. When the composite piece is molded over or interlocked with prongles, composite piece is effectively formed over and around prongles, as shown for example in FIG. 1A. Generally, a composite piece may be cast over and around, shaped over and around, sculpted over and around, and/or positioned over and around prongles.

In general, the steps associated with the methods of the invention may vary widely. Steps may be added, removed, altered, combined, and reordered without departing from the spirit or the scope of the invention.

The various aspects, features, embodiments or implementations of the invention described above may be used alone or in various combinations.

While this specification contains many specifics, these should not be construed as limitations on the scope of the disclosure or of what may be claimed, but rather as descriptions of features specific to particular embodiment of the disclosure. Certain features that are described in the context of separate embodiments may also be implemented in combination. Conversely, various features that are described in the context of a single embodiment may also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

In one embodiment, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

While embodiments and applications have been shown and described, it would be apparent to those skilled in the art having the benefit of this disclosure that many more modifications than mentioned above are possible without departing from the inventive concepts herein.

What is claimed is:

1. An assembly comprising:
    a substrate arrangement, the substrate arrangement including:
        a metal substrate; and
        a prongle layer, the prongle layer having a first base surface and a second base surface, the first base surface coupled to a top surface of the metal substrate, the second base surface including at least one protruding feature integral with the layer; and
    a non-metal layer, the non-metal layer being formed over the at least one protruding feature, wherein the non-metal layer engages the at least one protruding feature.

2. The assembly of claim 1, wherein the non-metal layer formed over the at least one protruding feature is molded over the at least one protruding feature.

3. The assembly of claim 1, wherein the prongle layer is molded onto the metal substrate.

4. The assembly of claim 1, wherein the prongle layer is bonded to the metal substrate.

5. The assembly of claim 1, wherein the at least one protruding feature is a wire, the wire being attached to the substrate arrangement.

6. The assembly of claim 5, wherein the wire is attached to the substrate arrangement through a wire bond.

7. The assembly of claim 1, wherein the at least one protruding feature is a solder ball.

8. The assembly of claim 1, wherein the prongle layer is formed from a metal material and the non-metal layer is a composite layer.

9. The assembly of claim 8, wherein the composite layer is formed from a thermoplastic material.

10. The assembly of claim 1, wherein the assembly comprises at least a portion of an electronic device.

11. The assembly of claim 10,
    wherein the substrate arrangement comprises a bezel, the bezel including at least one flange with a first surface, and
    wherein the first surface of the flange has the at least one protruding feature formed thereon and extending therefrom.

12. The assembly of claim 11, wherein the non-metal layer is a composite component, and wherein the composite component is formed over the at least one protruding feature and the flange, 13. The assembly of claim 10, wherein the composite component engages the least one protruding feature and the flange to engage the bezel.

14. The assembly of claim 10, wherein the bezel is formed from a metal materia

15. The assembly of claim 10, wherein the composite component is a thermoplastic component.

16. The assembly of claim 10, wherein the at least one protruding feature is integrally formed on or bonded to the flange.

17. The assembly of claim 10, wherein the at least one protruding feature is bonded to the flange by being molded onto the flange.

18. The assembly of claim 10, wherein the at least one protruding feature includes a wire bonded to the flange.

19. The assembly of claim 10, wherein the at least one protruding feature includes a solder ball.

* * * * *